(12) United States Patent
Hariharan et al.

(10) Patent No.: US 10,919,123 B2
(45) Date of Patent: Feb. 16, 2021

(54) PIEZO-ELECTRIC END-POINTING FOR 3D PRINTED CMP PADS

(71) Applicant: Applied Materials, Inc., Santa Clara, CA (US)

(72) Inventors: Venkat Hariharan, Lehi, UT (US); Rajeev Bajaj, Fremont, CA (US); Daniel Redfield, Morgan Hill, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 19 days.

(21) Appl. No.: 16/259,597

(22) Filed: Jan. 28, 2019

(65) Prior Publication Data
US 2019/0240802 A1    Aug. 8, 2019

Related U.S. Application Data

(60) Provisional application No. 62/626,461, filed on Feb. 5, 2018.

(51) Int. Cl.
*B24B 37/24* (2012.01)
*B24B 37/005* (2012.01)
(Continued)

(52) U.S. Cl.
CPC ............ *B24B 37/24* (2013.01); *B24B 37/005* (2013.01); *B24B 37/04* (2013.01); *B24B 37/22* (2013.01); *B24B 37/26* (2013.01); *B24B 49/10* (2013.01); *B24B 49/16* (2013.01); *B29C 64/112* (2017.08); *C09G 1/02* (2013.01); *H01L 21/3212* (2013.01); *H01L 21/7684* (2013.01); *H01L 21/76843* (2013.01); *H01L 21/76877* (2013.01)

(58) Field of Classification Search
CPC ......... B24B 1/00; B24B 37/005; B24B 37/04; B24B 37/042; B24B 37/24; B24B 49/10; B24B 49/16
USPC .............. 451/5, 8, 10, 11, 41, 285, 287, 288
See application file for complete search history.

(56) References Cited

U.S. PATENT DOCUMENTS 6,309,276 B1    10/2001    Tsai et al.
6,399,501 B2     6/2002    Birang et al.
(Continued)

OTHER PUBLICATIONS

PCT International Search Report and Written Opinion dated May 8, 2019, for International Application No. PCT/US2019/014253.

*Primary Examiner* — Eileen P Morgan
(74) *Attorney, Agent, or Firm* — Patterson + Sheridan LLP

(57) ABSTRACT

Embodiments described herein relate to methods of detecting a polishing endpoint using one or more sensors embedded in the polishing material of a polishing pad, the polishing pads, and methods of forming the polishing pads. In one embodiment, a method of polishing a substrate includes urging a to be polished surface of a substrate against a polishing surface of a polishing pad, the polishing pad having one or more sensors embedded in the polishing pad material thereof, wherein the polishing pad is mounted on a polishing platen of a polishing system, detecting a force exerted against a polishing surface of the polishing pad using the one or more sensors, converting the detected force into signal information, wirelessly communicating the signal information received from the one or more sensors to one or more interrogators disposed in the polishing platen, and changing one or more polishing conditions based on the signal information.

12 Claims, 10 Drawing Sheets

(51) Int. Cl.
*B24B 37/04* (2012.01)
*B24B 49/10* (2006.01)
*B24B 49/16* (2006.01)
*B24B 37/26* (2012.01)
*B24B 37/22* (2012.01)
*B29C 64/112* (2017.01)
*H01L 21/768* (2006.01)
*H01L 21/321* (2006.01)
*C09G 1/02* (2006.01)

(56) References Cited

U.S. PATENT DOCUMENTS

| | | | |
|---|---|---|---|
| 6,407,669 B1 | 6/2002 | Brown et al. | |
| 6,506,097 B1 | 1/2003 | Adams et al. | |
| 6,520,834 B1* | 2/2003 | Marshall | B24B 37/04 |
| | | | 451/10 |
| 6,950,193 B1 | 9/2005 | Discenzo | |
| 7,513,818 B2 | 4/2009 | Miller et al. | |
| 7,530,880 B2 | 5/2009 | Bajaj et al. | |
| 7,815,778 B2 | 10/2010 | Bajaj | |
| 7,846,008 B2 | 12/2010 | Bajaj | |
| 8,066,555 B2 | 11/2011 | Bajaj | |
| 8,075,745 B2 | 12/2011 | Bajaj | |
| 8,177,603 B2 | 5/2012 | Bajaj | |
| 8,292,692 B2 | 10/2012 | Bajaj | |
| 8,388,410 B2 | 3/2013 | Albright, Jr. | |
| 8,676,537 B2 | 3/2014 | Liu et al. | |
| 8,712,571 B2 | 4/2014 | Liu et al. | |
| 8,821,214 B2 | 9/2014 | Joseph | |
| 9,162,340 B2 | 10/2015 | Joseph et al. | |
| 9,254,545 B2* | 2/2016 | Park | B24B 37/20 |
| 9,669,512 B2 | 6/2017 | Bajaj et al. | |
| 9,776,361 B2 | 10/2017 | Krishnan et al. | |
| 9,873,180 B2 | 1/2018 | Bajaj et al. | |
| 9,993,907 B2 | 6/2018 | Murugesh et al. | |
| 2004/0106367 A1 | 6/2004 | Walker et al. | |
| 2005/0112998 A1* | 5/2005 | Matsuo | B24B 37/013 |
| | | | 451/5 |
| 2006/0014475 A1 | 1/2006 | Sekiya | |
| 2006/0249369 A1 | 11/2006 | Marangon et al. | |
| 2007/0032170 A1 | 2/2007 | Halley et al. | |
| 2007/0149094 A1* | 6/2007 | Choi | B24B 49/10 |
| | | | 451/8 |
| 2007/0243795 A1* | 10/2007 | Kobayashi | B24B 37/005 |
| | | | 451/5 |
| 2008/0004743 A1* | 1/2008 | Goers | B24B 53/017 |
| | | | 700/121 |
| 2008/0268760 A1* | 10/2008 | Bajaj | B24B 49/16 |
| | | | 451/526 |
| 2009/0130956 A1* | 5/2009 | Ohta | B24B 37/005 |
| | | | 451/6 |
| 2009/0308739 A1 | 12/2009 | Riker et al. | |
| 2009/0318062 A1 | 12/2009 | Chiu et al. | |
| 2011/0045744 A1 | 2/2011 | Feng et al. | |
| 2011/0048772 A1 | 3/2011 | Han | |
| 2011/0183583 A1 | 7/2011 | Joseph | |
| 2012/0315830 A1 | 12/2012 | Joseph et al. | |
| 2013/0052917 A1* | 2/2013 | Park | B24B 37/005 |
| | | | 451/8 |
| 2013/0283700 A1 | 10/2013 | Bajaj et al. | |
| 2014/0127973 A1* | 5/2014 | Motoshima | B24B 37/005 |
| | | | 451/11 |
| 2015/0114823 A1 | 4/2015 | Lee et al. | |
| 2015/0126099 A1 | 5/2015 | Krishnan et al. | |
| 2015/0375361 A1 | 12/2015 | Qian et al. | |
| 2016/0107287 A1 | 4/2016 | Bajaj et al. | |
| 2016/0107288 A1 | 4/2016 | Orilall et al. | |
| 2016/0107295 A1 | 4/2016 | Bajaj et al. | |
| 2016/0114458 A1 | 4/2016 | Bajaj et al. | |
| 2016/0136787 A1 | 5/2016 | Bajaj et al. | |
| 2016/0229023 A1 | 8/2016 | Lugg et al. | |
| 2017/0100817 A1 | 4/2017 | Ganapathiappan et al. | |
| 2017/0120416 A1 | 5/2017 | Chockalingam et al. | |
| 2017/0133252 A1 | 5/2017 | Fung et al. | |
| 2017/0136603 A1 | 5/2017 | Ganapathiappan et al. | |
| 2017/0203408 A1 | 7/2017 | Ganapathiappan et al. | |
| 2018/0043613 A1 | 2/2018 | Krishnan et al. | |
| 2018/0158707 A1* | 6/2018 | Hunter | G06K 7/10366 |
| 2018/0161954 A1 | 6/2018 | Bajaj et al. | |
| 2018/0229343 A1* | 8/2018 | Kim | H01L 21/68714 |

* cited by examiner

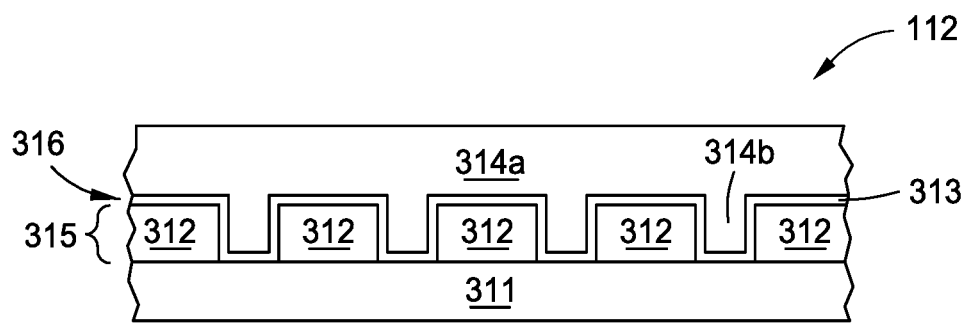
FIG. 3D
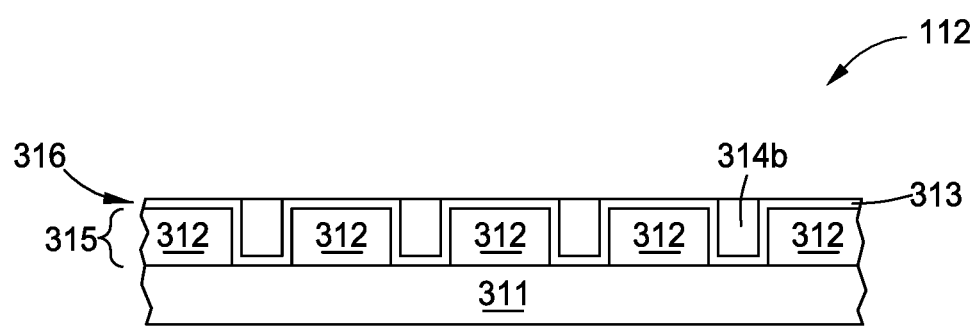
FIG. 3E
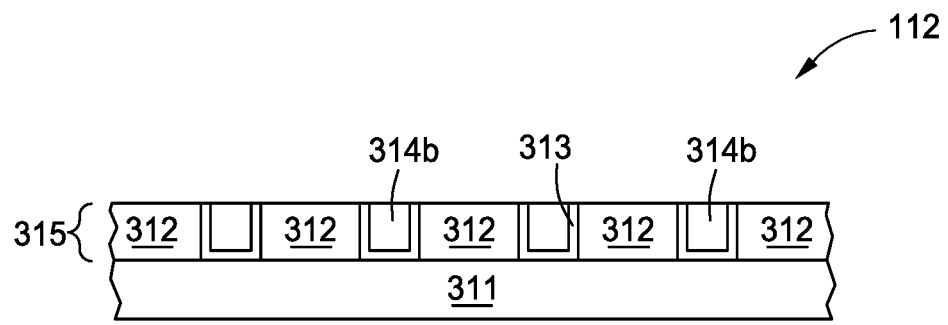
FIG. 3F

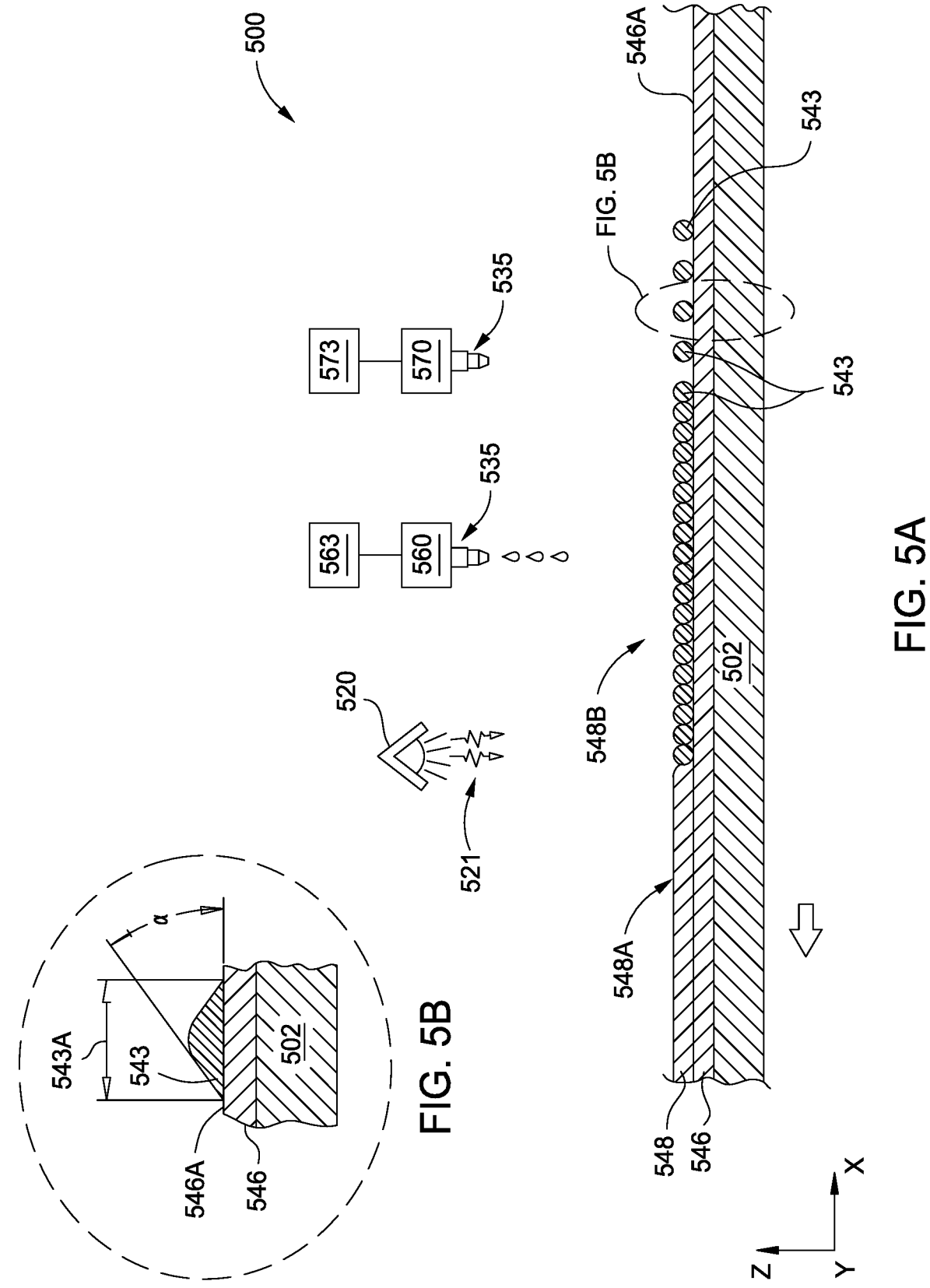

PIEZO-ELECTRIC END-POINTING FOR 3D PRINTED CMP PADS

CROSS-REFERENCE TO RELATED APPLICATIONS

This application claims priority to U.S. Provisional Application Ser. No. 62/626,461 filed on Feb. 5, 2018, which is herein incorporated by reference in its entirety.

BACKGROUND

Field

Embodiments described herein generally relate to chemical mechanical planarization (CMP) of a substrate in an electronic device fabrication process, and more particularly to polishing pads having sensors disposed and, or, embedded therein, methods of forming the polishing pads, and methods of using the polishing pads to detect a polishing endpoint during the chemical mechanical planarization of a substrate.

Description of the Related Art

Chemical mechanical polishing (CMP) is commonly used in the manufacture of high-density integrated circuits to planarize or polish a layer of material deposited on a substrate, by contacting the material layer to be planarized with a polishing pad mounted on a polishing platen, and moving the polishing pad and, or, the substrate (and thus the material layer surface on the substrate) in the presence of a polishing fluid and abrasive particles. Two common applications of CMP are planarization of a bulk film, for example pre-metal dielectric (PMD) or interlayer dielectric (ILD) polishing, where underlying features create recesses and protrusions in the layer surface, and shallow trench isolation (STI) and interlayer metal interconnect polishing, where polishing is used to remove a via, contact or trench fill material from the exposed surface (field) of the layer having the feature extending thereinto. For example, in interlayer metal interconnect polishing, a metal conductor, such as tungsten (W) or copper (Cu) which was deposited in openings in a dielectric film layer is also deposited on the field surface thereof, and the metal on the field must be removed therefrom before a next layer of metal or dielectric material can be formed thereover. Undesirable material remaining on the field surface of the substrate, typically known as under polishing, resulting from inadequate clearing of the material from the field surface during the CMP process can cause failure of the electronic device if not removed by reworking the substrate (further polishing of the substrate) which requires additional polishing time on a polishing system thereby reducing the capacity thereof. Conversely, overpolishing the substrate to ensure that fill material is removed from the field surface may result in undesirable dishing of the exposed surface of the fill material in the recessed features, such as vias, contacts and lines, and, or, trenches, and, or, erosion of the planarized surface in areas with high feature density. In addition, overexposure of some metals to a chemically active CMP polishing fluid can result in chemical conversion of the metal by the polishing fluid and thus coring, where the metal fill material no longer adheres to the side wall and base of the opening which it fills, and it pulls away during polishing.

Endpoint detection (EPD) methods are commonly used in CMP processes to determine when via, contact or trench fill material has been removed from the field (upper surface) of a layer. One conventional EPD method includes directing a light beam towards the substrate, detecting light reflected therefrom, and monitoring for changes in the reflectance of the substrate to detect the removal of a reflective material from over the field of an underlayer surface. Typically, the light is directed through an opening in the polishing platen and a window in the polishing pad positioned adjacent to the opening in the polishing platen which allows the light to pass therethrough. Because the opening and window, and thus the EPD system, are swept underneath the substrate by the rotation of the polishing platen, changes in the reflectance of the substrate can only be detected as the EPD sweeps thereunder once per revolution. As a result, the resolution of the EPD signal is limited by the rotation speed of the polishing platen.

Accordingly, what is needed in the art is an EPD system, and polishing articles and apparatus used therewith, capable of continuously monitoring polishing conditions and changes therein.

SUMMARY

The present disclosure generally provides methods and articles related to electronic device manufacturing, in particular, chemical mechanical planarization (CMP) processes using polishing pads having sensors disposed and, or, embedded therein to detect a polishing endpoint during the chemical mechanical planarization of a substrate, methods of forming polishing pads having sensors embedded therein, and polishing pads thus formed.

In one embodiment, a method of polishing a substrate includes urging a substrate against a polishing surface of a polishing pad mounted on a polishing platen of a polishing system. Herein, the polishing pad includes one or more sensors embedded in the polishing pad material thereof and one or more remote communication devices communicatively coupled to the one or more sensors, wherein each of the one or more remote communication devices is embedded in the polishing pad. The method further includes detecting a force exerted against a polishing surface of the polishing pad using the one or more sensors, converting the detected force into signal information, wirelessly communicating the signal information received from the one or more sensors to one or more interrogators disposed in the polishing platen, and changing one or more polishing conditions based on the signal information.

In another embodiment, a polishing pad includes a sub-polishing element, a plurality of polishing elements extending from the sub-polishing element; and one or more sensors. Each of the one or more sensors is disposed between a polishing surface of one or more of the plurality of polishing elements and a portion of the sub-polishing element.

In another embodiment, a method of forming a polishing pad includes forming a first layer of a sub-polishing element, the first layer having one or more opening disposed in the surface thereof, partially curing the first layer, respectively positioning one or more sensors in the one or more openings formed in the first layer, and forming a second layer on the at least partially cured first layer and on the one or more sensors.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3D-3F illustrate the on substrate result of the method set forth in FIG. 3C.

FIG. 5A is a schematic cross-sectional view of an example additive manufacturing system used to practice the methods described herein, according to one embodiment.

FIG. 5B is a close up cross-sectional view of a droplet dispensed onto the surface of a previously formed layer using the additive manufacturing system described in FIG. 5A.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to chemical mechanical planarization (CMP) of a substrate in an electronic device fabrication process, and more particularly to polishing pads having sensors disposed and, or, embedded in the polishing pad material thereof, methods of forming the polishing pads, and methods of using the polishing pads to detect a polishing endpoint during the chemical mechanical planarization of a substrate.

Embodiments described herein include a communication and control system that uses a plurality of remote communication devices, such as wireless communication devices, respectively coupled to, or integrally formed with, a plurality of sensors which are embedded in a polishing material of a polishing pad. The remote communication devices enable the transmission of dynamic force information measured by the plurality of sensors to a controller of the polishing system via one or more interrogators disposed in the polishing pad. The communication and control system provided herein enables the inclusion of more sensors in the polishing pad, and lower polishing pad manufacturing costs, than a polishing pad having a plurality of sensors where information from each sensor is communicated to a controller via respective wired communication links. Thus, the embodiments described herein provide for increased resolution of end point detection signals when compared to conventional endpoint detection methods. In some embodiments, the communication and control system comprises a one way communication protocol where dynamic force information received by a sensor (and sometimes sensor identification information) is communicated to a remote communication device, from the remote communication device to an interrogator, and from the interrogator to a controller of the polishing system. In other embodiments, the communication and control system comprises a two way communication protocol which includes the one way communication protocol described above and further includes communicating information from the controller and, or, the interrogator to the remote communication device. For example in one embodiment, the controller may assign each sensor a unique identification code corresponding to a location on the polishing platen disposed thereunder. The unique identification code is then communicated to the controller along with the dynamic force information detected by the sensor enabling the controller to compare the dynamic force information to the location of the sensor.

Figure 1:
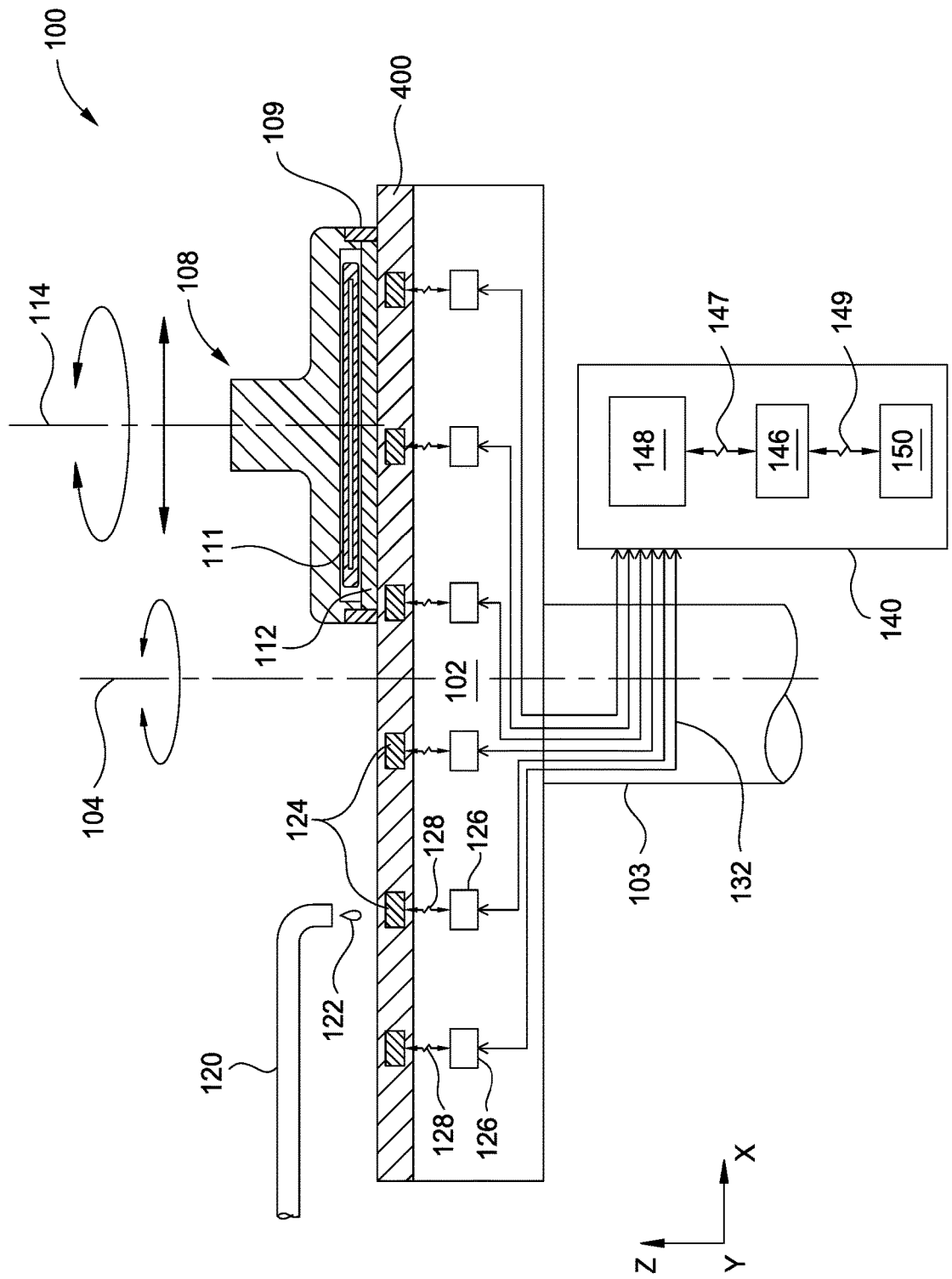
FIG. 1 is a schematic cross-sectional view of an example polishing system configured to practice the methods described herein, according to one embodiment.

FIG. 1 is a schematic sectional view of an example polishing system 100 configured to practice the methods described herein, according to one embodiment. The polishing system 100 typically includes a polishing platen 102 rotatably disposed about a platen axis 104, a polishing pad 400 mounted on the upper surface of the polishing platen 102, a substrate carrier 108 rotatably disposed about a carrier axis 114, and a fluid delivery arm 120 for delivering polishing fluid 122 to the polishing surface of the polishing pad 400. Typically, the polishing fluid 122 is a polishing slurry comprising abrasive particles, a cleaning fluid, a chemically active solution, water, or a combination thereof. In some embodiments, the polishing system 100 further includes a pad conditioning apparatus (not shown) for maintaining a desired surface texture on the polishing pad 400. Typically, the polishing pad 400 is secured to the polishing platen 102 using an adhesive, such as a pressure sensitive adhesive, disposed between the polishing pad 400 and the polishing platen 102.

The substrate carrier 108, facing the polishing platen 102 and the polishing pad 400 mounted thereon, includes a flexible diaphragm 111 configured to impose different pressures against different regions of a substrate 112 while urging the to be polished surface or the being polished surface of the substrate 112 against the polishing surface of the polishing pad 400. The substrate carrier 108 further includes a carrier ring 109 surrounding the substrate 112. During polishing, a downforce on the carrier ring 109 urges the carrier ring 109 against the polishing pad 400 which prevents the substrate 112 from laterally slipping from therebetween. Typically, the polishing platen 102 is disposed on a shaft 103 which rotates the polishing platen 102 about a platen axis 104 in an opposite rotational direction from the rotation direction of the substrate carrier 108 while the substrate carrier 108 sweeps back and forth from an inner diameter of the polishing platen 102 to an outer diameter of the polishing platen 102 to, in part, reduce uneven wear of the polishing pad 400. Herein, the polishing platen 102 and the polishing pad 400 have a surface area that is greater than a to be polished surface area of the substrate 112, however, in some polishing systems, the polishing pad 400 has a surface area that is less than the to be polished surface area of the substrate 112.

The polishing pad 400 herein includes one or more sensors 124, such as one or more pressure sensors, shear sensors, and, or, force sensors embedded and, or, disposed in the polishing pad material thereof. The one or more sensors 124 measure a dynamic force exerted against the polishing surface of the polishing pad 400 by the carrier ring 109 and the substrate 112 as the polishing pad 400 passes thereunder. Herein, the one or more sensors 124 include piezo-electric sensors, piezo-resistive sensors, and, or, micro-electro-mechanical (MEMS) sensors, such as MEMS load cells, or any other suitable sensor configured to measure a dynamic force exerted on the polishing pad 400 by the substrate 112 of carrier ring 109 urged thereagainst. The dynamic force is transmitted to the sensor 124 through the material of the polishing pad 400 disposed thereabove. The sensor 124 converts the dynamic force measurement to signal information which is then communicated to a controller 140. For example, in one embodiment the one or more sensors 124 are piezo electric sensors that convert a mechanical force (load) applied thereto to signal information in the form of an electrical signal, such as a voltage, which is then communicated to a controller 140 of the polishing system 100 using a communication system described herein.

Figure 2:
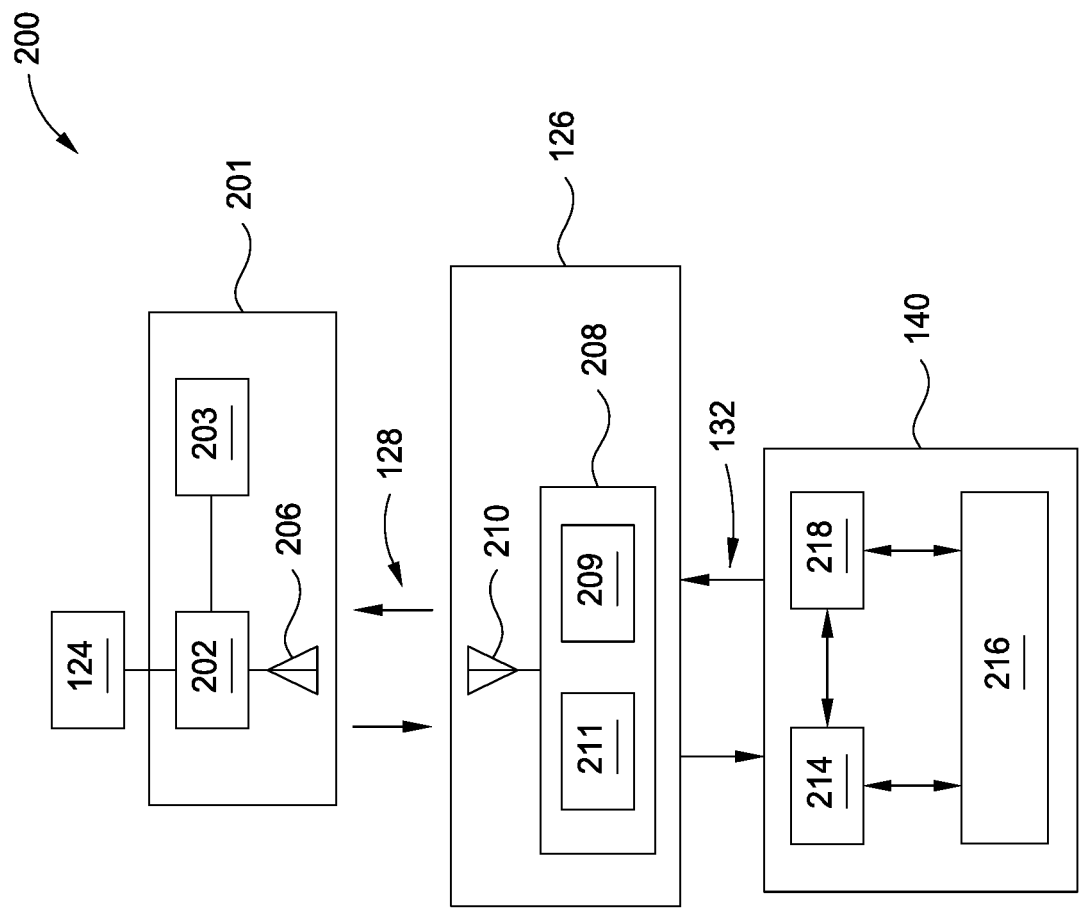
FIG. 2 illustrates a communication and control system used to practice the methods provided herein, according to one embodiment.

Herein, each of the one or more sensors 124 are communicatively coupled a respective remote communication device, such as the remote communication device 201 shown in FIG. 2, embedded in the polishing pad 400 proximate to the sensor 124. In some embodiments the remote communication device is a radio frequency (RF) communication device, for example an RF identification (RFID) device. The remote communication device 201 is configured to wirelessly communicate with a respective interrogator 126 disposed in and, or, embedded in the polishing platen 102 using a wireless communication technique where the remote communication device 201 wirelessly communicates signal information (received from a sensor 124 communicatively coupled thereto) to a respective interrogator 126 through a first communication link 128.

Typically, each of the interrogators 126 are further communicatively coupled to a controller 140 of the polishing system 100 which receives the signal information from the respective interrogators 126 through one or more respective second communication links 132. The signal information received by the controller 140 is processed and utilized by the controller 140 using one or more software applications, such as a middleware application 148, a polishing system software application 146, and, or, a fab-level software application 150. In some embodiments, after receiving information from one or more interrogators 126, the controller 140 uses a middleware application 148 to process the information and derive data that the middleware application 148 sends to the polishing system software application 146 through a third communication link 147. The third communication link 147 herein comprises a wired connection (e.g., Ethernet) or a wireless communication protocol (e.g., Bluetooth). In some embodiments, the middleware application 148 is located on the polishing platen 102 or the shaft 103 and includes one or more filters for reducing noise in the information received from the interrogators 126, one or more analog to digital (A/D) convertors, and, or, a wireless communication protocol, such as a Bluetooth protocol, for wirelessly communicating with the polishing system software application 146. In some embodiments, the polishing system software application 146 further sends the information received from the middleware application 148 to the fab-level software application 150 through a fourth communication link 149. Herein the fourth communication link 149 is a wired connection. In other embodiments, the fourth communication link 149 is a wireless communication protocol.

In some embodiments, the polishing pad 400 is mounted on the polishing platen 102 so that the one or more sensors 124 are aligned with predetermined locations of the polishing platen 102. This enables the controller 140 to use identification information stored in the remote communication devices 201 (coupled to the sensors 124 and proximate thereto) to determine the relative positions of the one or more sensors 124 and the substrate 112 during the substrate polishing process. In other embodiments, identification information (to be used by the controller for determining the relative positions of the sensors 124 and the substrate carrier 108 is transmitted to, and stored in, each of the one or more remote communication devices 201 after the polishing pad 400 is positioned on the polishing platen 102. In a further embodiment, the relative positions of the substrate carrier 108 and the polishing platen 102, and thus the relative positions of the substrate 112 and the one or more sensors 124, are further determined using position sensors, such as optical encoders, coupled to a platen drive motor (not shown) coupled to the shaft 103 and substrate carrier sweep motor (not shown) coupled to the substrate carrier 108. In another and, or, further embodiment, the relative position of a sensor 124 to the substrate 112 is determined using pressure, force, and or shear information detected by the sensor 124 as it passes beneath the carrier ring 109 and a to be polished surface of a substrate 112 during the substrate polishing process, as further described in FIG. 3.

FIG. 2 illustrates a communication and control system 200 used to practice the methods provided herein, according to one embodiment. The communication and control system 200 includes one or more sensors 124, such as the one or more sensors 124 shown in FIG. 1, where each of the one or more sensors 124 are communicatively coupled to a respective remote communication device 201. In other embodiments, one or more pluralities of sensors 124 are each communicatively coupled to a respective remote communication device 201. Herein, one or more remote communication devices 201 are RF communication devices, such as RFID devices, in other embodiments the remote communication devices are any suitable wireless communication devices. The one or more remote communication devices 201 are configured to wirelessly communicate information received from the one or more respective sensors 124 (or one or more respective pluralities of sensors 124) to one or more respective interrogators 126. In other embodiments, one or more pluralities of remote communication devices 201 are configured to wirelessly communicate information received from the one or more respective sensors 124 (or one or more respective pluralities of sensors 124) to one or more respective interrogators 126.

The controller 140 herein includes a programmable central processing unit (CPU) 214 that is operable with a memory 218 (e.g., non-volatile memory) and a mass storage device (not shown), an input control unit (not shown), and a display unit (not shown), such as power supplies, clocks, cache, input/output (I/O) circuits, and the like, coupled to the various components of a polishing system, such as the polishing system 100 described in FIG. 1, to facilitate control of a substrate polishing process. In some embodiments, the controller 140 includes hardware for monitoring substrate processing through system level sensors in the polishing system 100.

To facilitate control of a polishing system, such as the polishing system 100, including the communication and control system 200, the CPU 214 is one of any form of general purpose computer processor used in an industrial setting, such as a programmable logic controller (PLC), for controlling various polishing system component and sub-processors. The memory 218, coupled to the CPU 214, is non-transitory and is typically one or more of readily available memory such as random access memory (RAM), read only memory (ROM), floppy disk drive, hard disk, or any other form of digital storage, local or remote. Support circuits 216 are coupled to the CPU 214 for supporting the processor in a conventional manner. Signal generation instructions, data reception, and analysis from the remote communication devices 201 via the interrogator 126 may be performed by the CPU 214 and stored in the memory 218, typically as a software routine. In some embodiments, the software routine is stored and, or, executed by a second CPU (not shown) that is remotely located from the hardware being controlled by the CPU 214.

Herein, the memory 218 is in the form of a computer-readable storage media containing instructions (e.g., non-volatile memory), that when executed by the CPU 214, facilitates the operation of a polishing system, such as the polishing system 100, including operation of the remote communication devices 201 and the interrogators 126. The instructions in the memory 138 are in the form of a program product such as a program that implements the methods of the present disclosure (e.g. middleware application, equipment software application etc.). The program code may conform to any one of a number of different programming languages. In one example, the disclosure may be implemented as a program product stored on computer-readable storage media for use with a computer system. The program(s) of the program product define functions of the embodiments (including the methods described herein). In some embodiments, the polishing system software application 146 and the middleware application 148 are executed by use of the CPU 214 and memory 218 found within the controller 140.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Herein, a sensor 124, such as the one or more sensors 124 embedded in and, or, disposed in the polishing material of a polishing pad 400 in FIG. 1, is communicatively coupled to a remote communication device 201 which receives information from the sensor 124 and wirelessly communicates the information to an interrogator, such as the interrogators 126 of FIG. 1, via first communication link 128, such as a wireless communication link. Typically, the remote communication device 201 includes a tag 202 communicatively coupled to the sensor 124, memory 203, and a first antenna 206 which is coupled to or integrally manufactured in the tag 202. In some embodiments, the sensor 124 is integrally manufactured with the remote communication device 201. Herein, the tag 202 is a passive tag configured to receive a signal, such as a radio frequency signal, from the interrogator 126, and utilize the electromagnetic energy of the received signal to transmit information received from the sensor 124 communicatively coupled thereto back to the interrogator 126 using the first antenna 206. Herein, the remote communication device 201 is located less than a critical communication distance from the interrogator 126 where the critical communication distance is the distance beyond which electromagnetic energy of the signal provided by the interrogator 126 and, or, used by the passive tag to transmit information back thereto are insufficient for reliable communication therebetween. Typically, the critical communication distance depends upon the amount of power associated with the signal generated by an interrogator 126 and the size and power of a tag transmitter. In some embodiments, an electrical signal provided by the sensor 124, such as in embodiments where the sensor is a piezo electric sensor, provides sufficient power to the tag 202 to enable the transmission of information received therefrom to the interrogator 126. In other embodiments, such as in embodiments where the interrogator 126 is located more than a critical distance from the remote communication device 201, the tag 202 is an active tag comprising a suitable power source, such as a battery, electrically coupled thereto. Herein, each of one or more sensors 124 is communicatively coupled to a respective remote communication device 201, however, in some embodiments each remote communication device 201 is communicatively coupled to a respective plurality of sensors of one or more pluralities of sensors 124.

Typically, the interrogator 126 includes a reader 208 and a second antenna 210. The reader 208 includes and, or, is coupled to a power source (not shown), such as an RF power source, and is configured to transmit, via the second antenna 210, an electromagnetic signal to be received by the remote communication device 201. Herein, the reader 208 includes an RF modulator 211 and an interrogator controller 209 configured to manage signal transmission and, or, reception to and, or, from the reader 208. In one embodiment, the RF modulator 211 is configured to generate and, or, modulate an RF signal having a wavelength of about 13.56 MHz. In one embodiment, the interrogator 126 and a respective remote communication device 201 (or respective plurality of remote communication devices 201) are positioned in a spatial relationship having a distance therebetween of less than about twelve inches, such as less than about two inches, or less than about one inch. In some embodiments, to avoid cross talk such that the RF energy propagated by an interrogator 126 is only picked up by the desired remote communication devices 201 (and not other remote communication device proximate thereto), a specific range of RF energy is utilized for each of the interrogators 126 and the remote communication devices 201 (or pluralities of remote communication devices 201) in respective communication therewith. In such embodiments, the RF energy has a relative received signal strength (RSSI) value in the range of about −30 dB to about −60 dB. In some embodiments, the one or more interrogators 126 emit an ultrahigh frequency (UHF) in the range of 856 to 960 MHz. In some embodiments, each of the one or more remote communication devices 201 has a unique identification code that that is stored within the memory 203 thereof. The unique identification code is transmitted to the interrogator 126 and used by a middleware application, such as the middleware application 148 described in FIG. 1, to determine which of two or more remote communication devices 201 information is received from and, or, which remote communication devices 201 information is to be transferred to during one or more of the processes described herein. In some embodiments, the unique identification code is provided by the controller 140 and is communicated to the remote communication device 201 (and stored in the memory 203 thereof) via an interrogator 126 and communication links 132 and 128.

Figure 3B:
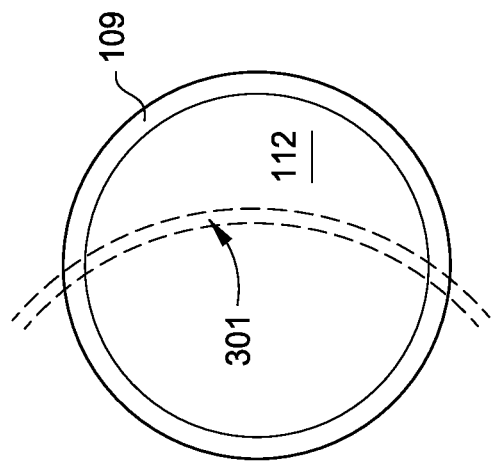
FIG. 3B illustrates the path of a sensor relative to a surface of a substrate during polishing thereof, according to one embodiment.
Figure 3A:
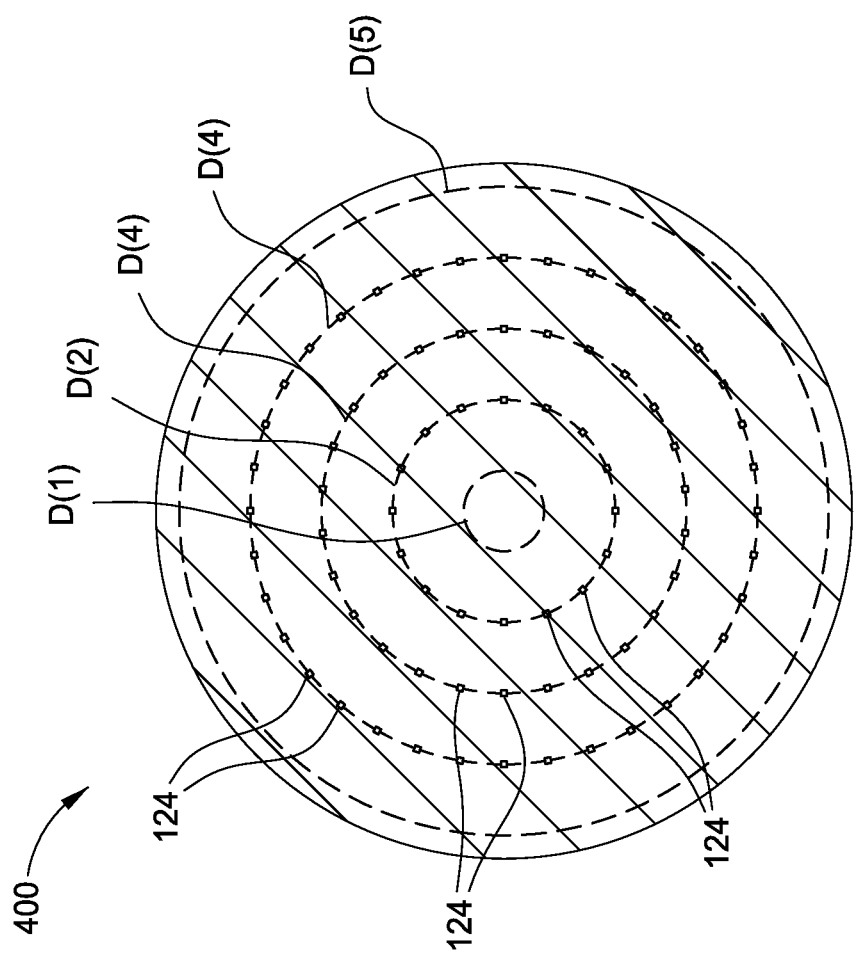
FIG. 3A is a schematic sectional plan view of a polishing pad having a plurality of sensors disposed therein, according to one embodiment.

FIG. 3A is a schematic sectional plan view of a polishing pad having a plurality of sensors disposed therein, according to one embodiment. The plurality of sensors 124 are arranged along a plurality of circles concentrically disposed about the center of the polishing pad where each of the plurality of circles have a respective diameter D(2)-D(4) and where each of the plurality of circles are between the inner diameter D(1) and the outer diameter D(5). Herein, the inner diameter D(1) and outer diameter D(5) are defined by the sweep range, i.e., the movement of the substrate carrier from a location adjacent to the outer diameter to a location adjacent to the center of the pad during substrate polishing. Typically, the sensors 124 are spaced apart so that at least one sensor 124 of the plurality of sensors 124 is disposed between the to be or being polished surface of a substrate and the polishing platen as the polishing pad is rotated about the platen axis. In other embodiments, the sensors are arranged in a grid pattern, along radial lines extending from the center of the polishing pad, or in any other suitable pattern so that at least one or more sensors 124 are disposed between a to be or being polished surface of a substrate and the polishing platen during substrate polishing.

FIG. 3B illustrates the path of a sensor 124 relative to surface of a substrate, according to one embodiment. The sensor path 301 is determined by the radial position of the sensor embedded the polishing pad, the inner diameter D(1) and outer diameter D(2) of the substrate carrier sweep path, the sweep speed of the substrate carrier, the rotational speed of the substrate carrier, and thus the rotational speed of the substrate disposed therein, and the rotational speed of the platen. Typically, on the polishing system such as the polishing system 100 described in FIG. 1 and where the substrate carrier makes less than a full rotation as the sensor passes thereunder, the sensor path 301 relative to the to be or being polished surface of the substrate comprises an arc where the radius of the arc is dependent on the relative rotational speeds of the substrate carrier and the polishing platen. In other embodiments, such as in embodiments where the substrate carrier rotates at least a plurality of revolutions as the sensor passes thereunder or where the polishing system is a linear, orbital, or oscillation polishing system, the path will have a different shape, for example a hypotrochoid shape or an epitrochoid shape, which are also known as Spirograph shapes.

Figure 3C:
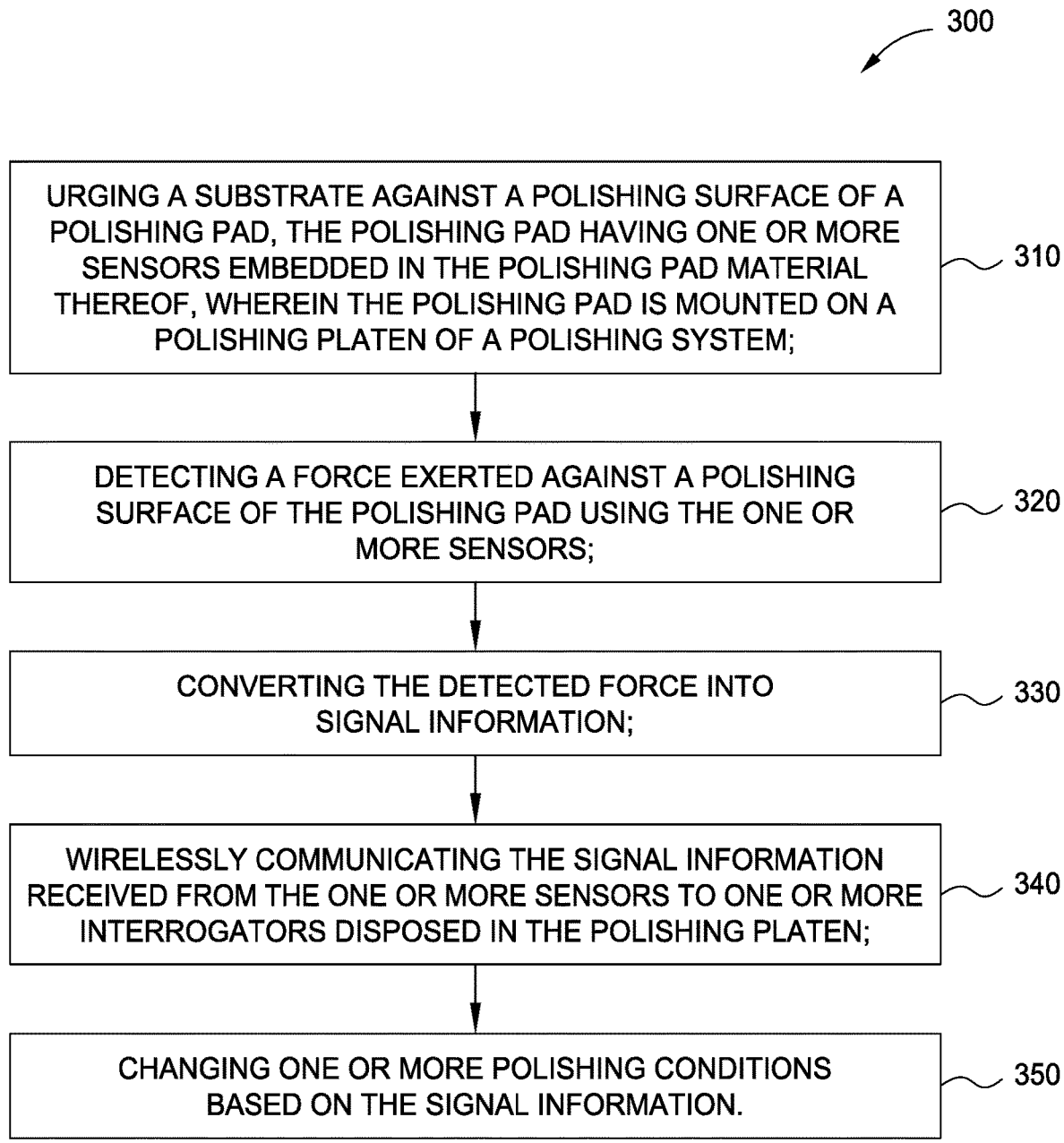
FIG. 3C is a flow diagram of a method of polishing a substrate using the polishing pads described herein, according to one embodiment.

FIG. 3C is a flow diagram of a method of polishing a substrate, according to one embodiment. FIGS. 3D-3F illustrate the result of the method 300 set forth in FIG. 3C on a substrate. At activity 310 the method 300 includes urging the too be polished surface or layer of a substrate against a polishing surface of a polishing pad, where the polishing pad has one or more sensors embedded in the polishing pad material thereof, and where the polishing pad is mounted on a polishing platen of a polishing system. In some embodiments, the one or more sensors include piezo-electric sensors, piezo-resistive sensors, micro-electro-mechanical (MEMS) sensors, or combinations thereof.

In FIG. 3D a to be polished substrate includes a patterned layer 315 formed on a surface of a substrate 311, such as a silicon substrate. The patterned layer 315 includes a dielectric layer 312, for example $SiO_2$, $SiN_xO_y$, SiN, SiOC, SiC, Si low-k polymers, such as a polyamide, high-k dielectric materials, or combinations thereof. High-K dielectric materials herein include aluminum-(Al), hafnium-(Hf), lanthanum-(La), or zirconium-(Zr) based oxides, oxynitrides, and, or, silicon nitrides ($Si_xN_y$), in single or layered structures (e.g., a $SiO_2$/high-k/$SiO_2$) or combinations thereof, having a plurality of metal features 314 disposed therein. Typically, the metal features 314 are formed by forming a plurality of openings in the dielectric layer 312 before depositing a barrier layer 313, for example Ru, Ta, TaN, TiN, or TiW, on the dielectric layer 312 and in the openings formed therein and then depositing a metal layer 314a, such as W or Cu, on the barrier layer 313. In other embodiments, the to be polished substrate includes a patterned layer formed in the surface of the substrate, such as a plurality of dielectric features disposed in trenches formed in the substrate, also known as shallow trench isolation (STI) features, further including a dielectric layer formed on a field surface of the substrate and the STI features formed therein.

At activity 320 the method 300 includes detecting the force exerted against a polishing surface of the polishing pad using the one or more sensors. Herein, the force is a dynamic force exerted against the polishing surface of the polishing pad by the substrate as the polishing pad, and one or more of the one or more sensors, passes therebeneath. The dynamic force detected by the one or more sensors depends on the relative motion of the substrate to the polishing pad, a downforce exerted on the substrate from the substrate carrier, and the frictional force between a surface of the substrate and a surface of the polishing pad. The friction between the surface of the substrate and the surface of the polishing pad depends, at least in part, on the layer of material of the substrate being processed as the frictional forces between different material layers and the polishing pad will also be different. For example, if the relative motion of the substrate to the polishing pad and pressure exerted on the substrate by the substrate carrier are maintained at respective constant values during polishing the frictional force between the metal layer 314a and a surface of the polishing pad will be different, typically more, than the frictional force between the barrier layer 313 and the polishing pad. Likewise, the frictional force between the barrier layer 313 and the polishing pad will be different, typically more, than the frictional force between polishing pad and the dielectric surfaces of the patterned layer 315. The difference in frictional force between material layers results in a difference in the dynamic force exerted by the substrate against the polishing surface of the polishing pad, where the dynamic force is transmitted through the polishing material of the polishing pad to the one or more sensors disposed and, or, embedded therein, as material layers are removed (cleared) from field surfaces of the substrate during the polishing process.

At activity 330 the method 300 includes converting the detected force into signal information using one or more sensors, typically electrical signal information, for example a voltage. At activity 340 the method 300 includes wirelessly communicating the signal information received from the one or more sensors to one or more interrogators disposed in the polishing platen.

At activity 350 the method 300 includes changing one or more polishing conditions based on the signal information. For example, as the metal layer 314a is cleared from a field surface of the barrier layer 313, such as shown in FIG. 3E, the dynamic force detected by the one or more sensors will change, and thus the signal information related thereto will change. The change in dynamic force, detected by the sensors and communicated to a controller, may be used to trigger a change in polishing conditions, such as a change in the composition of the polishing fluid, the polishing fluid flowrate, the downforce exerted against the substrate by the substrate carrier, polishing platen rotation speed, carrier rotation speed, and, or, polishing pad conditioning parameters. Likewise, as the barrier layer 313 is cleared from a field surface of the patterned layer, such as shown in FIG. 3F, a detected change in dynamic force may be used to trigger a second change in polishing conditions, such as the polishing conditions described above and further including ending the polishing sequence. In other embodiments, the method includes detecting a change in the dynamic force exerted by a substrate against a surface of the polishing pad as a dielectric layer is removed from a field of a patterned surface of the substrate, such as a patterned surface of a silicon substrate comprising a plurality of dielectric shallow trench isolation features formed therein.

In further embodiments, the one or more sensors are used to determine localized clearing of fill material from the field surface of the substrate, and thus a material removal rate profile across the substrate surface. In a desired model polishing process the thickness of the field layer disposed on a to be polished surface of a substrate is perfectly uniform across the surface of the substrate and so is the removal of material therefrom. However, in reality, non-uniform incoming thickness and, or, non-uniform removal of fill material from the field surface results in localized clearing of fill material from the field surface at different times during the polishing sequence. Localized clearing at different times (resulting from non-uniform incoming thickness and, or, non-uniform material removal rates across the surface of the substrate) means that at least one portion of the substrate surface is being over-polished while fill material is still being cleared from other portions of the substrate surface. Over-polishing of local portions of the substrate causes undesirable dishing of the exposed surface of the fill material in the recessed features, such as vias, contacts and lines, and, or, trenches, and, or, undesirable erosion of the planarized surface in areas with high feature density.

Typically, polishing uniformity, i.e., the difference in removal rate of material from the field surface of the substrate across the substrate surface, changes over the lifetimes of the polishing pad, the pad conditioning apparatus, and, or, the substrate carrier ring and, or, with changing polishing conditions, such as the temperature of the polishing pad. As fill material, such as a metal layer or a dielectric layer is cleared from a field surface of the substrate, a dynamic force detected by the one or more sensors will change, and thus the signal information related thereto will change. Accordingly, as the one or more sensors pass beneath the substrate, localized clearing of material from the substrate surface will result in differences in frictional force exerted against the polishing pad thereunder and thus cause respective differences in the dynamic force detected by the one or more sensors, along the length and at a plurality of locations of the one or more respective sensor paths, e.g., the sensor path 301 described in FIG. 3B. These differences in dynamic force enable the creation of a material removal profile along the length of the respective paths. In one embodiment, the material removal profile is used as a basis to adjust polishing parameters in situ (during the polishing of the same substrate), for example by increasing and, or, decreasing the pressures exerted against the substrate by the flexible diaphragm at different regions thereof. In other embodiments, the material removal profile is used to adjust polishing parameters for subsequently polished substrates. In some embodiments, a polishing endpoint is when substantially all of the fill material is cleared from a field surface of the substrate, where substantially all includes more than 90% fill material clearance from the field surface, such as more than 95%, for example more than 98%.

Figure 4A:
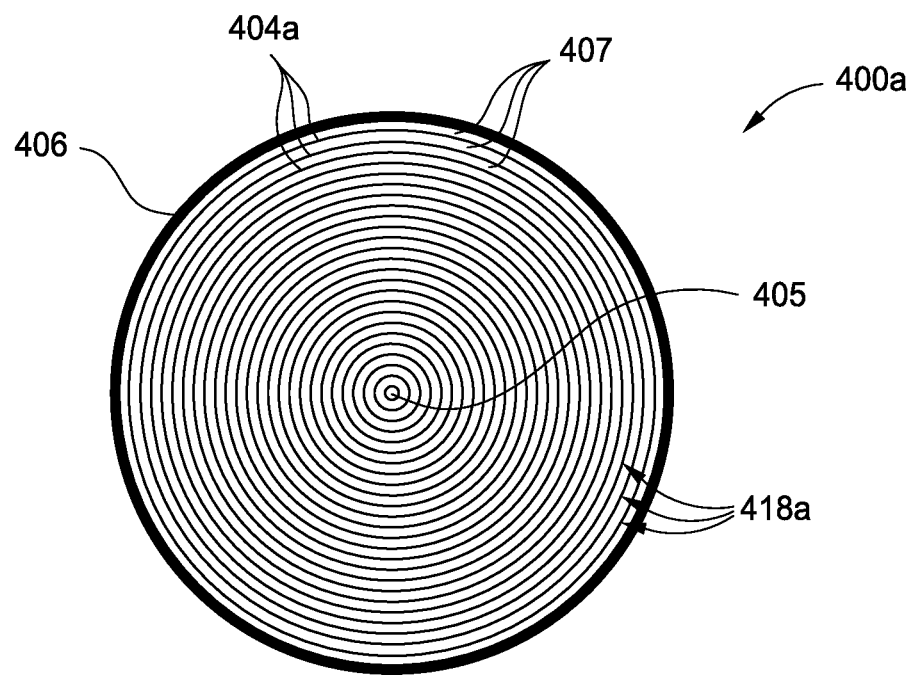
FIGS. 4A and 4C are schematic top down views of polishing pads, according to embodiments described herein.
Figure 4B:
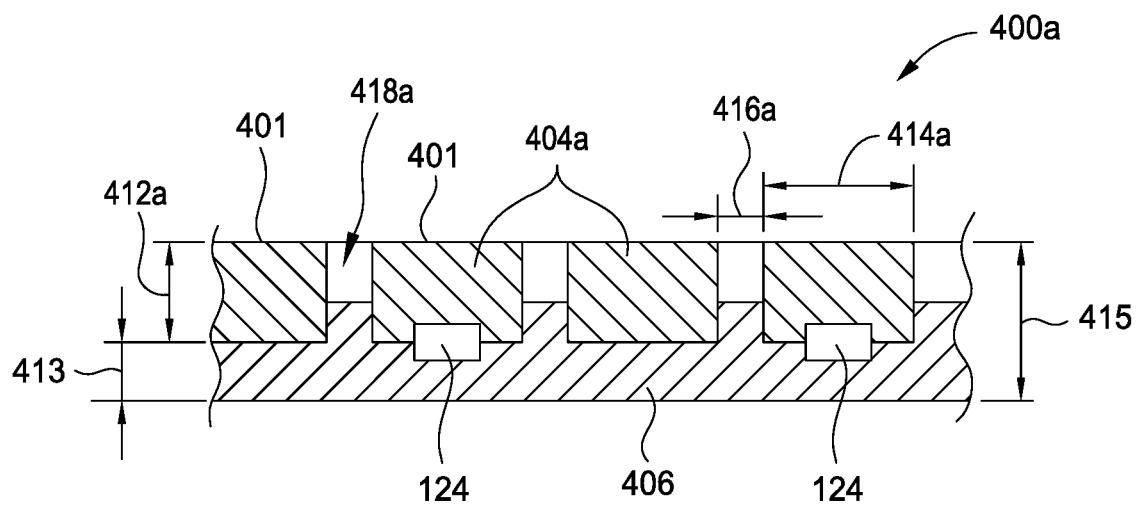
FIGS. 4B and 4D are schematic cross sectional views of portions of the polishing pads shown in FIGS. 4A and 4C respectively.
Figure 4C:
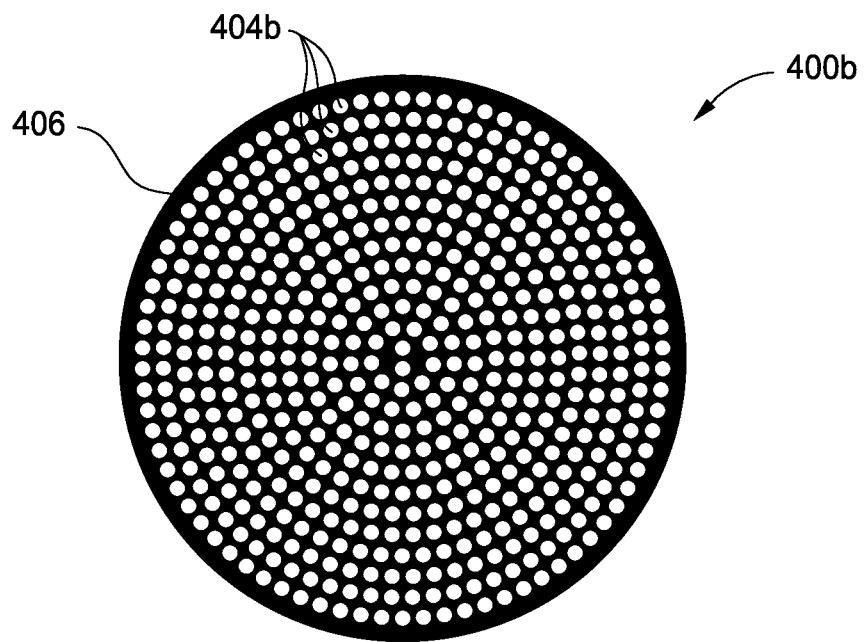
Figure 4D:
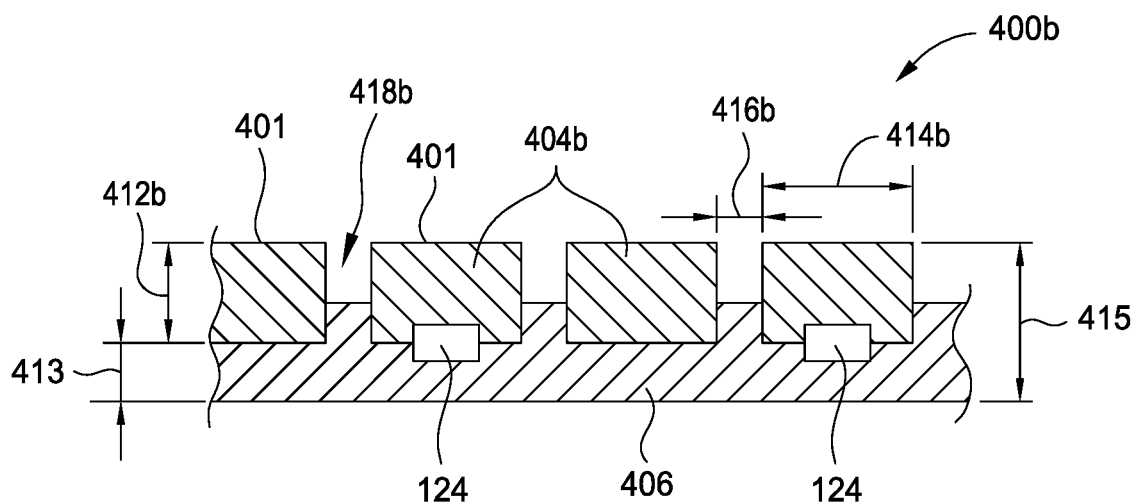

FIGS. 4A and 4C are schematic top down views of polishing pads, formed according to embodiments described herein. FIGS. 4B and 4D are schematic cross sectional views of portions of the polishing pads shown in FIGS. 4A and 4C respectively. The polishing pads 400a, 400b can be used as the polishing pad 400 in the polishing system 100 of FIG. 1.

In FIGS. 4A-4B, the polishing pad 400a includes a plurality of polishing elements 404a, a sub-polishing element 406, and one or more sensors 124 located at the interfacial joining of discrete ones of the polishing elements 404a with the sub-polishing element 406 at multiple circumferential locations thereof. The plurality of polishing elements 404a are disposed on and, or, within the sub-polishing element 406 and extend from a surface thereof. Herein, one or more of the plurality of polishing elements 404a have a first thickness 412, the sub-polishing element 406 extends beneath the polishing element 404a at a second thickness 413, and the polishing pad 400a has an overall third thickness 415. As shown in FIG. 4A, the polishing pad 400a includes a plurality of polishing elements 404a including an upwardly extending post 405 disposed in the center of the polishing pad 400a and a plurality of upwardly extending concentric rings 407 disposed about the post 405 and spaced radially outwardly therefrom. The plurality of polishing elements 404a and the sub-polishing element 406 resultantly define a plurality of circumferential channels 418a disposed in the polishing pad 400a between each of the polishing elements 404a and between a plane of the polishing surface 401 of the polishing pad 400a and a surface of the sub-polishing element 406. The plurality of channels 418 enable the distribution of a polishing fluid across the polishing pad 400a and to the interface region between the polishing pad 400a and the to be polished, or being polished, surface of a substrate. In other embodiments, the patterns of the polishing elements 404a are rectangular, spiral, fractal, random, another pattern, or combinations thereof. Herein, the width 414a of the polishing element(s) 404a in the radial direction of the polishing pad 400a is between about 250 microns and about 20 millimeters, such as between about 250 microns and about 10 millimeters, such as between about 250 microns and about 5 millimeters, for example between about 250 microns and about 2 millimeters and a pitch 416 of the polishing element(s) 404a (radial center to center spacing) is between about 0.5 millimeters and about 5 millimeters. In some embodiments, the width 414a and, or, the pitch 416 in the radial direction varies across the radius of the polishing pad 400a, 400b to define zones of pad material properties. In some embodiments, the width of polishing elements having a sensor 124 disposed beneath the polishing surface 401 thereof have a larger width than polishing elements that do not have a sensor disposed beneath their polishing surface 401. Additionally, in some embodiments, the center of the series of polishing elements 404a is offset from the center of the sub-polishing element 406. Herein, each of the one or more sensors 124 include a remote communication device integrally manufactured therein which enables the sensor to wirelessly communicate information to a respective interrogator, such as the interrogators 126 described in FIGS. 1-2, and, or, wirelessly receive information, such as identification information, therefrom. In some embodiments, a plurality of sensors 124 are configured to wirelessly communicate information to a respective interrogator and, or, wirelessly receive information therefrom.

In FIGS. 4C-4D, the polishing elements 404b of the polishing pad 400b are cylindrical columns extending from the sub-polishing element 406. In other embodiments, the polishing elements 404b are of any suitable cross-sectional shape, for example individual columns with toroidal, partial toroidal (e.g., arc), oval, square, rectangular, triangular, polygonal, irregular shapes, or combinations thereof. The polishing elements 404b and sub-polishing element 406 define flow regions 418b between the polishing elements 404b. In some embodiments, the shapes and widths 414b of the polishing elements 404b, and the distances 416b therebetween, are varied across the polishing pad 400b to tune the hardness, mechanical strength, fluid transport characteristics, or other desirable properties of the complete polishing pad 400b. The width 414b of the polishing element(s) 404b is between about 250 microns and about 5 millimeters, such as between about 250 microns and about 2 millimeters, typically the polishing elements are spaced apart from each other by a distance 416b between about 0.5 millimeters and about 5 millimeters.

As illustrated in FIGS. 4B and 4D, the polishing elements 404a, 404b are supported by a portion of the sub-polishing element 406 (e.g., portion within the first thickness 412). Therefore, when a load is applied to the polishing surface 401 of the polishing pads 400a, 400b (e.g., top surface) by a substrate during processing, the load will be transmitted through the polishing elements 404a, 404b and a portion of the sub-polishing element 406 located therebeneath.

Herein, the polishing elements 404a, 404b and the sub-polishing element 406 each comprise a continuous polymer phase formed from of at least one of oligomeric and, or, polymeric segments, compounds, or materials selected from the group consisting of: polyamides, polycarbonates, polyesters, polyether ketones, polyethers, polyoxymethylenes, polyether sulfone, polyetherimides, polyimides, polyolefins, polysiloxanes, polysulfones, polyphenylenes, polyphenylene sulfides, polyurethanes, polystyrene, polyacrylonitriles, polyacrylates, polymethylmethacrylates, polyurethane acrylates, polyester acrylates, polyether acrylates, epoxy acrylates, polycarbonates, polyesters, melamines, polysulfones, polyvinyl materials, acrylonitrile butadiene styrene (ABS), halogenated polymers, block copolymers and random copolymers thereof, and combinations thereof.

In some embodiments, the materials used to form portions of the polishing pads 400a, 400b, such as the polishing elements 404a, 404b and the sub-polishing element 406 include the reaction product of at least one ink-jettable pre-polymer composition that is a mixture of functional polymers, functional oligomers, reactive diluents, and, or, curing agents to achieve the desired properties of a polishing pad 400a, 400b. In some embodiments, interfaces between, and coupling between, the polishing elements 404a, 404b and the sub-polishing element 406 include the reaction product of pre-polymer compositions, such as a first curable resin precursor composition, used to form the sub-polishing element 406 and a second curable resin precursor composition, used to form the polishing elements 404a, 404b. In general, the pre-polymer compositions are exposed to electromagnetic radiation, which may include ultraviolet radiation (UV), gamma radiation, X-ray radiation, visible radiation, IR radiation, and microwave radiation and also accelerated electrons and ion beams to initiate polymerization reactions, thereby forming the continuous polymer phases of the polishing elements 404a, 404b and the sub-polishing element 406. The method(s) of polymerization (cure), or the use of additives to aid the polymerization of the polishing elements 404a, 404b and the sub-polishing element 406, such as sensitizers, initiators, and, or, curing agents, such as through cure agents or oxygen inhibitors, are not restricted for the purposes hereof.

In one embodiment, the sub-polishing element 406 and the plurality of polishing elements 404a,b are formed from a sequential deposition and post deposition cure process and comprise the reaction product of at least one radiation curable resin precursor composition, wherein the radiation curable precursor compositions contain functional polymers, functional oligomers, monomers, and, or, reactive diluents that have unsaturated chemical moieties or groups, including but not restricted to: vinyl groups, acrylic groups, methacrylic groups, allyl groups, and acetylene groups.

Typical material composition properties that may be selected using the methods and material compositions described herein include storage modulus E', loss modulus E", hardness, tan δ, yield strength, ultimate tensile strength, elongation, thermal conductivity, zeta potential, mass density, surface tension, Poison's ratio, fracture toughness, surface roughness ($R_a$), glass transition temperature (Tg) and other related properties. For example, storage modulus E' influences polishing results such as the removal rate from, and the resulting planarity of, the material layer surface of a substrate. Typically, polishing pad material compositions having a medium or high storage modulus E' provide a higher removal rate for dielectric films used for PMD, ILD, and STI, and cause less undesirable dishing of the upper surface of the film material in recessed features such as trenches, contacts, and lines. Polishing pad material compositions having a low storage modulus E' generally provide more stable removal rates over the lifetime of the polishing pad, cause less undesirable erosion of a planer surface in areas with high feature density, and cause reduced micro scratching of the material surface. Characterizations as a low, medium, or high storage modulus E' pad material composition at temperatures of 30° C. (E'30) and 90° C. (E'90) are summarized in Table 1:

TABLE 1

| | Low Storage Modulus Compositions | Medium Modulus Compositions | High Modulus Compositions |
|---|---|---|---|
| E'30 | 5 MPa-100 MPa | 100 MPa-500 MPa | 500 MPa-3000 MPa |
| E'90 | <17 MPa | <83 MPa | <500 MPa |

FIG. 5A is a schematic sectional view of an additive manufacturing system 500 used to form a polishing pad, such as polishing pads 400a, 400b, according to embodiments disclosed herein. The additive manufacturing system 500 herein includes a first dispensing head 560 for dispensing droplets of a first precursor composition 563 and a second dispensing head 570 for dispensing droplets of a second precursor composition 573. Typically, the dispensing heads 560, 570 move independently of each other and independently of a manufacturing support 502 during the printing process to enable the placement of droplets of the precursor compositions 563, 573 at selected locations on the manufacturing support 502 to form a polishing pad, such as the polishing pads 400a, 400b. The selected locations are collectively stored as a CAD-compatible printing pattern which is readable by an electronic controller (not shown) that directs the motion of the manufacturing support 502, the motion of the dispensing heads 560, 570 and the delivery of the droplets of the precursor compositions 563, 573 from one or more nozzles 535.

Herein, the first precursor composition 563 is used to form the sub-polishing element 406 and the second precursor composition 573 is used to form the polishing elements 404a, 404b of the polishing pads 400a, 400b shown in FIGS. 4A-4D. Typically, the first and second precursor compositions 563 and 573 each comprise a mixture of one or more of functional polymers, functional oligomers, functional monomers, and, or, reactive diluents that are at least monofunctional, and undergo polymerization when exposed to free radicals, photoacids. Lewis acids, and, or, electromagnetic radiation.

Examples of functional polymers used in the first and, or, second precursor compositions 563 and 573 include multifunctional acrylates including di, tri, tetra, and higher functionality acrylates, such as 1,3,5-triacryloylhexahydro-1,3,5-triazine or trimethylolpropane triacrylate.

Examples of functional oligomers used in the first and, or, second precursor compositions 563 and 573 include monofunctional and multifunctional oligomers, acrylate oligomers, such as aliphatic urethane acrylate oligomers, aliphatic hexafunctional urethane acrylate oligomers, diacrylate, aliphatic hexafunctional acrylate oligomers, multifunctional urethane acrylate oligomers, aliphatic urethane diacrylate oligomers, aliphatic urethane acrylate oligomers, aliphatic polyester urethane diacrylate blends with aliphatic diacrylate oligomers, or combinations thereof, for example bisphenol-A ethoxylate diacrylate or polybutadiene diacrylate. In one embodiment, the functional oligomer comprises tetrafunctional acrylated polyester oligomer available from Allnex Corp. of Alpharetta, Ga. as EB40® and the functional oligomer comprises an aliphatic polyester based urethane diacrylate oligomer available from Sartormer USA of Exton, Pa. as CN991.

Examples of monomers used in the first and, or, second precursor compositions 563 and 573 include both monofunctional monomers and multifunctional monomers. Monofunctional monomers include tetrahydrofurfuryl acrylate (e.g. SR285 from Sartomer®), tetrahydrofurfuryl methacrylate, vinyl caprolactam, isobornyl acrylate, isobornyl methacrylate, 2-phenoxyethyl acrylate, 2-phenoxyethyl methacrylate, 2-(2-ethoxyethoxy)ethyl acrylate, isooctyl acrylate, isodecyl acrylate, isodecyl methacrylate, lauryl acrylate, lauryl methacrylate, stearyl acrylate, stearyl methacrylate, cyclic trimethylolpropane formal acrylate, 2-[[(Butylamino) carbonyl]oxy]ethyl acrylate (e.g. Genomer 1122 from RAHN USA Corporation), 3,3,5-trimethylcyclohexane acrylate, or mono-functional methoxylated PEG (350) acrylate. Multifunctional monomers include diacrylates or dimethacrylates of diols and polyether diols, such as propoxylated neopentyl glycol diacrylate, 1,6-hexanediol diacrylate, 1,6-hexanediol dimethacrylate, 1,3-butylene glycol diacrylate, 1,3-butylene glycol dimethacrylate 1,4-butanediol diacrylate, 1,4-butanediol dimethacrylate, alkoxylated aliphatic diacrylate (e.g., SR9209A from Sartomer®), diethylene glycol diacrylate, diethylene glycol dimethacrylate, dipropylene glycol diacrylate, tripropylene glycol diacrylate, triethylene glycol dimethacrylate, alkoxylated hexanediol diacrylates, or combinations thereof, for example SR562, SR563, SR564 from Sartomer®.

Examples of reactive diluents used in the first and, or, second precursor compositions 563 and 573 include monoacrylate, 2-ethylhexyl acrylate, octyldecyl acrylate, cyclic trimethylolpropane formal acrylate, caprolactone acrylate, isobornyl acrylate (IBOA), or alkoxylated lauryl methacrylate.

Examples of photoacids used in the first and, or, second precursor compositions 563 and 573 include onium salts such as Omnicat 250, Omnicat 440, and Omnicat 550, manufactured by manufactured by IGM Resins USA Inc. of Charlotte N.C. and compositional equivalents thereof, triphenylsulfonium triflate, and triarylsulfonium salt type photo acid generators such as CPI-210S available from San-Apro Ltd. of Tokyo, Japan, and compositional equivalents thereof.

In some embodiments, the first and, or, second precursor compositions 563 and 573 further comprise one or more photoinitiators. Photoinitiators used herein include polymeric photoinitiators and, or, oligomer photoinitiators, such as benzoin ethers, benzyl ketals, acetyl phenones, alkyl phenones, phosphine oxides, benzophenone compounds and thioxanthone compounds that include an amine synergist, combinations thereof, and equivalents thereof. For example, in some embodiments photoinitiators include Irgacure® products manufactured by BASF of Ludwigshafen, Germany, or equivalent compositions. Herein, the first and second precursor compositions 563 and 573 are formulated to have a viscosity between about 80 cP and about 400 cP at about 25° C., between about 12 cP and about 30 cP at about 70° C., or between 10 cP and about 40 cP for temperatures between about 50° C. and about 150° C. so that the precursor compositions 563, 573 may be effectively dispensed through the nozzles 535 of the dispensing heads 560, 570.

FIG. 5A further illustrates a curing process using the additive manufacturing system 500, according to one embodiment, such as a portion of one or more previously formed layers 546 of a polishing pad element, such sub-polishing element 406. During processing, the dispensing heads 560, 570 deliver a plurality of droplets of one or more precursor compositions, such as the plurality of droplets 543 of the first precursor composition 563 to a surface 546A of the one or more previously formed layers 546. As used herein, the terms curing and cured includes partially curing the droplets to form a partially cured desired sub-layer, as complete curing of the droplets may limit desirable reactions with droplets of subsequently deposited sub-layers. The plurality of droplets 543 form one of a plurality of second sub-layers 548 which includes a cured portion 548A and an uncured portion 548B where the cured portion has been exposed to radiation 521 from the radiation source 520. As shown, the cured portion 548A comprises the reaction product of the first precursor composition 563 having a thickness between about 0.1 micron and about 1 mm, such as between about 5 microns and about 100 microns, for example between about 10 microns and about 30 microns. In some embodiments, curing of droplets of the precursor compositions 563, 573 is performed in an oxygen free or oxygen limited atmosphere, such as a nitrogen or nitrogen rich atmosphere.

FIG. 5B is a close up cross-sectional view of a droplet 543 dispensed onto the surface 546A of the one or more previously formed layers 546. Once dispensed onto the surface 546A, the droplet 543 spreads to a droplet diameter 543A having a contact angle α. The droplet diameter 543A and contact angle α are a function of at least the material properties of the precursor composition, the energy at the surface 546A (surface energy) of the one or more previously formed layers 546, and time. In some embodiments, the droplet diameter 543A and the contact angle α will reach an equilibrium after a short amount of time, for example less than about one second, from the moment that the droplet contacts the surface 546A of the one or more previously formed layers 546. In some embodiments, the droplets 543 are cured before reaching an equilibrium droplet diameter and contact angle α. Typically, the droplets 543 have a diameter of between about 10 and about 200 micron, such as between about 50 micron and about 70 microns before contact with the surface 546A and spread to between about 10 and about 500 micron, between about 50 and about 200 microns, after contact therewith. In some embodiments, the surface energy of the one or more previously formed layers 546 and of the cured portion 548A of the second sub-layer 548 is between about 30 mJ/m$^2$ and about 45 mJ/m$^2$.

Figure 6A:
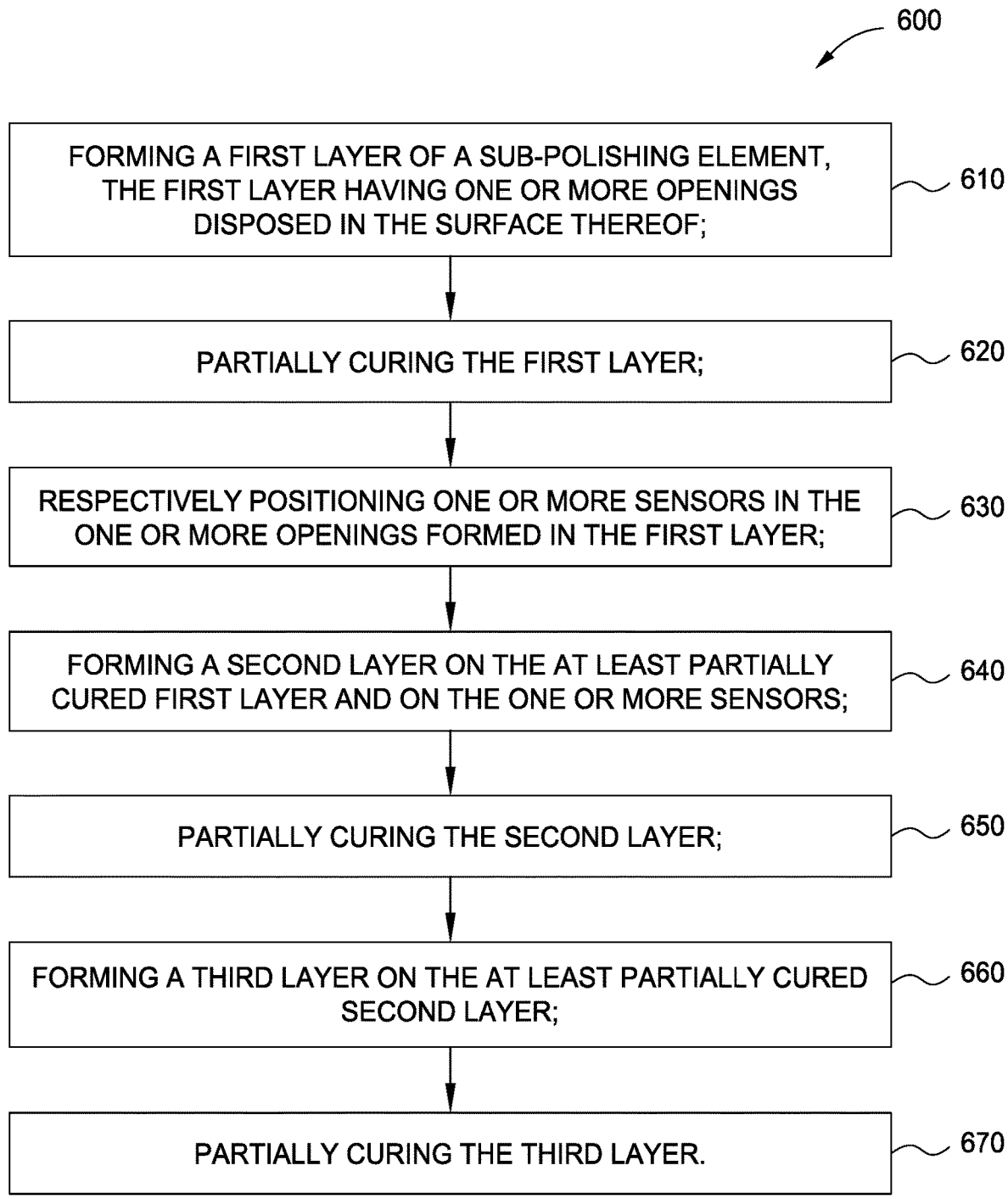
FIG. 6A is a flow diagram of a method of forming the polishing pads described herein, according to one embodiment.
Figure 6B:
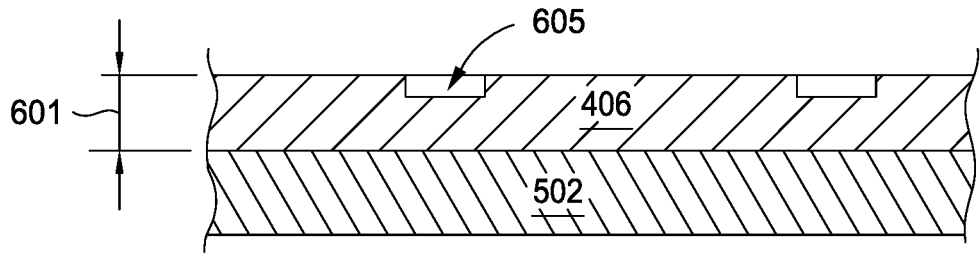
FIGS. 6B-6D illustrate the on substrate results of the method set forth in FIG. 6A.
Figure 6C:
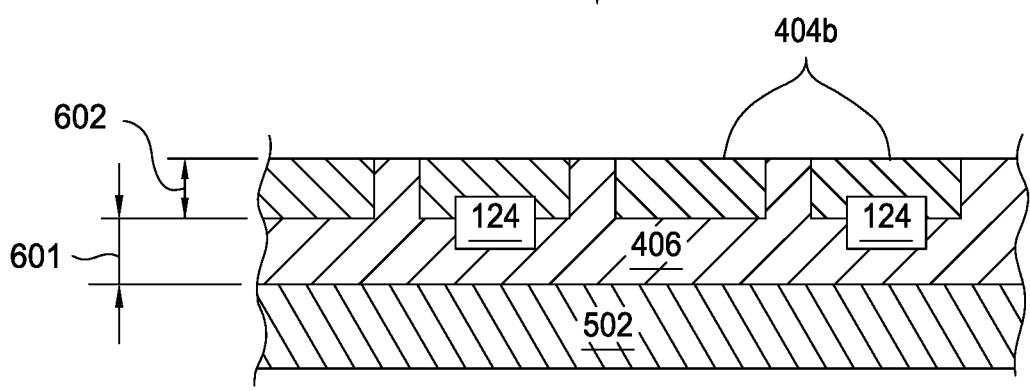
Figure 6D:
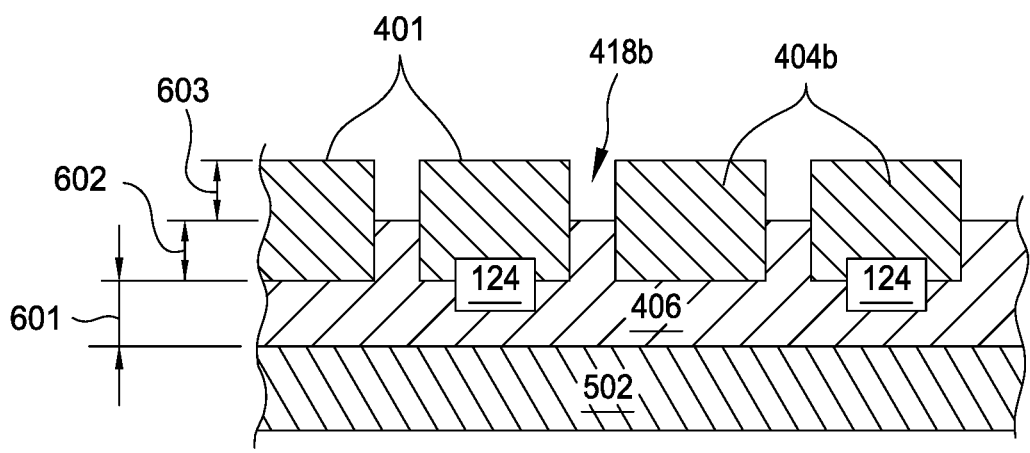

FIG. 6A is a flow diagram of a method 600 of forming a polishing article, such as the polishing pad 400a shown in FIGS. 4C-4D according to one embodiment. FIGS. 6B-6D illustrate the method 600 set forth in FIG. 6A. At activity 610 the method 600 includes forming a first layer 601 of a sub-polishing element 406, the first layer 601 having one or more openings disposed in a surface thereof. Forming the first layer 601 generally includes dispensing a plurality of droplets of a first precursor composition using an additive manufacturing process, such as the additive manufacturing process described herein, to form at least a portion of the sub-polishing element 406. Herein, the precursor compositions are dispensed onto a manufacturing support 502, or onto a previously formed first sub-layer of the first layer 601.

At activity 620 the method 600 includes at least partially curing the first layer 601. Partially curing herein comprises polymerization of the dispensed precursor compositions, typically by exposure of droplets of the precursor compositions to an electromagnetic radiation source, such as a UV radiation source. In some embodiments, forming the first layer 601 includes sequentially forming a plurality of first sub-layers where each of first sub-layers is formed by dispensing a plurality of first droplets of the first precursor composition and at least partially curing the dispensed droplets before forming a next sub-layer thereon.

Activity 630 of the method 600 includes positioning a sensor, such as the sensors 124 described in FIGS. 1-3 and the remote communication device 201 communicatively coupled thereto or the sensors 124 described in FIGS. 4A-4B having a remote communication device integrally manufactured therewith, in each of the one or more openings 605 formed in the first layer 601. In other embodiments, openings are not formed in the first layer 601 and the one or more sensors are placed on the surface thereof.

Activity 640 of the method 600 includes forming a second layer 602 on the at least partially cured first layer 601 and on the one or more sensors 124. Herein, the second layer 602 comprises at least portions of the sub-polishing element 406, and portions of one or more polishing elements 404b, as shown in FIG. 6C. The one or more sensors 124 are now interposed between the sub-polishing element 406 and the one or more polishing elements 404b. Forming the second layer 602 comprises dispensing the first precursor composition and a second precursor composition to form at least portions of each of the sub-polishing element 406 and of the one or more polishing elements 404b respectively. In other embodiments, a portion of the sub-polishing element 406 is further interposed between the one or more sensors 124 and respective polishing element 404b disposed thereabove. In other embodiments, the one or more openings 605 are formed in portions of the polishing elements 404b so that a sensor 124 positioned in the respective polishing element 404b is surrounded by the material thereof.

At activity 650 the method 600 includes partially curing the second layer 602. In some embodiments, forming the second layer 602 includes forming a plurality of second sub-layers where each second sub-layer is formed by dispensing a plurality of first droplets of the first precursor composition and a plurality of second droplets of the second precursor composition and at least partially curing the dispensed droplets before forming a next second sub-layer thereon.

At activity 660 the method 600 includes forming a third layer 603 on the at least partially cured second layer, where the third layer 603 comprises at least portions of each of the one or more polishing elements 404b, as shown in FIG. 6D. Forming the third layer 603 comprises dispensing a plurality of droplets of the second precursor composition to form the at least portions of each of the plurality of polishing elements 404b. In some embodiments, forming the third layer 603 includes sequentially forming a plurality of third sub-layers where each third sub-layer is formed by dispensing a plurality of second droplets of the second precursor composition and at least partially curing the dispensed droplets before forming a next sub-layer thereon. In other embodiments, the third layer is formed on the first layer.

At activity 670 the method 600 includes at least partially curing the third layer 603. Typically, the first and second droplets form chemical bonds at the interfaces thereof during partially curing of each of the sub-layers and further form chemical bonds with the partially cured precursor compositions of a previously formed sub-layer. In embodiments herein, the sub-polishing element 406 and the plurality of polishing elements 404b form a continuous polymer phase having discrete material properties within the respective polishing elements and, or, features of the polishing pad.

While the foregoing is directed to embodiments of the present disclosure, other and further embodiments of the disclosure may be devised without departing from the basic scope thereof, and the scope thereof is determined by the claims that follow.

The invention claimed is:
1. A method of polishing a substrate, comprising:
urging the substrate against a polishing surface of a polishing pad to remove one or more material layers from a patterned surface of the substrate, wherein
the patterned surface comprises a plurality of openings formed therein and the one or more material layers are disposed on the patterned surface and in the plurality of openings,
the polishing pad comprises a plurality of sensors embedded in a polishing pad material thereof, and
the polishing pad is mounted on a polishing platen of a polishing system;
detecting removal of the one or more material layers from the patterned surface, comprising:
detecting a frictional force exerted by the substrate against the polishing surface of the polishing pad using the plurality of sensors;
converting the detected frictional force into signal information;
wirelessly communicating the signal information received from the plurality of sensors to one or more interrogators disposed in the polishing platen;
detecting a change in the signal information, the change in the signal information corresponding to a change in the detected frictional force as at least one of the one or more material layers are removed from at least a portion of the patterned surface; and changing one or more polishing conditions based on the detected change in signal information.

2. The method of claim 1, wherein the plurality of sensors are dynamic force sensors.

3. The method of claim 1, wherein the plurality of sensors are piezo-electric sensors, piezo-resistive sensors, micro-electro-mechanical (MEMS) sensors, or combinations thereof.

4. The method of claim 3, wherein the plurality of sensors are piezo-electric sensors.

5. The method of claim 1, wherein the patterned surface comprises a dielectric layer and at least one of the one or more material layers is a metal layer.

6. The method of claim 5, wherein the one or more interrogators are communicatively coupled to a controller of the polishing system.

7. The method of claim 1, wherein changing one or more polishing conditions comprises changing a polishing fluid composition, changing a polishing fluid distribution, changing a polishing fluid flowrate, changing a rotation speed of the polishing platen, changing a rotation speed of a substrate carrier having the substrate disposed therein, changing pad conditioning parameters, ending a substrate polishing sequence, or combinations thereof.

8. The method of claim 1, wherein the polishing pad comprises:
   a sub-polishing element;
   a plurality of polishing elements extending from the sub-polishing element to form the polishing surface; and
   the plurality of sensors, wherein each of the plurality of sensors is disposed between the polishing surface and a portion of the sub-polishing element; and
   a plurality of remote communication devices communicatively coupled to the plurality of sensors, wherein each of the plurality of remote communication devices is embedded in the polishing pad.

9. The method of claim 8, wherein the plurality of sensors are piezo-electric sensors, piezo-resistive sensors, micro-electro-mechanical (MEMS) sensors, or combinations thereof.

10. The method of claim 8, wherein the plurality of sensors are piezo-electric sensors.

11. The method of claim 8, wherein the sub-polishing element and the plurality of polishing elements form a continuous polymer phase.

12. The method of claim 8, wherein the plurality of sensors arranged along a plurality of circles concentrically disposed about the center of the polishing pad.

* * * * *